US010263350B2

(12) United States Patent
Huo et al.

(10) Patent No.: US 10,263,350 B2
(45) Date of Patent: Apr. 16, 2019

(54) ELECTRICAL CONNECTOR

(71) Applicant: Molex, LLC, Lisle, IL (US)

(72) Inventors: Wei-Jie Huo, Shanghai (CN); Hao Yin, Shanghai (CN)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/759,610

(22) PCT Filed: Sep. 8, 2016

(86) PCT No.: PCT/US2016/050683
§ 371 (c)(1),
(2) Date: Mar. 13, 2018

(87) PCT Pub. No.: WO2017/048573
PCT Pub. Date: Mar. 23, 2017

(65) Prior Publication Data
US 2019/0044261 A1  Feb. 7, 2019

(30) Foreign Application Priority Data

Sep. 14, 2015  (CN) .................... 2015 2 0709020 U (51) Int. Cl.
*H01R 12/70* (2011.01)
*H01R 13/50* (2006.01)
*H01R 13/405* (2006.01)
*H01R 12/71* (2011.01)
*H01R 24/00* (2011.01)

(52) U.S. Cl.
CPC ......... *H01R 12/707* (2013.01); *H01R 12/716* (2013.01); *H01R 13/405* (2013.01); *H01R 13/50* (2013.01); *H01R 23/02* (2013.01)

(58) Field of Classification Search
CPC .. H01R 12/707; H01R 12/716; H01R 13/405; H01R 13/50
See application file for complete search history.

(56) References Cited

U.S. PATENT DOCUMENTS

| 6,053,763 A * | 4/2000 | Brennan | ............... H01R 43/205 |
| | | | 439/491 |
| 6,752,656 B2 | 6/2004 | Ho | |
| 7,291,039 B2 | 11/2007 | Shin | |
| 2002/0028610 A1 | 3/2002 | Yamada | |
| 2005/0186843 A1 | 8/2005 | Tsai | |
| 2009/0311887 A1 | 12/2009 | Zhu | |

FOREIGN PATENT DOCUMENTS

| TW | 539296 U | 6/2003 |
| TW | M251312 U | 11/2004 |

* cited by examiner

*Primary Examiner* — Abdullah A Riyami
*Assistant Examiner* — Nader J Alhawamdeh
(74) *Attorney, Agent, or Firm* — Molex, LLC (57) ABSTRACT

An electrical connector comprises an insulative body and at least two fitting nails. The insulative body is provided with at least two receiving grooves. An upper edge contour of each fitting nail comprises at least one stepped contour which cooperates with an inner upper wall surface of the receiving groove so as to limit a position of the fitting nail moving toward the upper and a position of the fitting nail moving toward the front, so as to allow the fitting nail to be firmly fixed in the receiving groove of the insulative body.

9 Claims, 13 Drawing Sheets

ELECTRICAL CONNECTOR

RELATED APPLICATIONS

This application is a national stage of International Application No. PCT/US2016/050683, filed Sep. 8, 2016, which claims priority to Chinese Application No. 201520709020.6, filed Sep. 14, 2015, both of which are incorporated herein by reference in their entirety.

TECHNICAL FIELD

The present disclosure relates to an electrical connector.

BACKGROUND ART

Taiwanese utility model patent TWM251312 discloses a flat-plate type connector fixing insertion plate which comprises a base plate portion and at least a barb portion formed at an upper edge of the base plate portion and being gradually pointed toward a first lateral direction of the base plate portion so as to correspondingly insert into an upper edge of an insertion groove of a connector. However, the fixed insertion plate has the barb portion, after the fixed insertion plate is inserted into the insertion groove of the connector, the fixed insertion plate is forcedly fixed in the insertion groove made of plastic via the barb portion; such a design will result in that the barb portion will scrape and damage the insertion groove during insertion and mounting, the amount of the retention force is not easily controlled, and the fixed insertion plate is easily loosen after mounted, also would result in non-conveniences in mounting, such as high effort is required during insertion and the fixed insertion plate is not easily positioned.

Taiwanese patent publication No. TW539296U discloses an improved fixing ear latch of an electronic connector for strengthening the positioning effect of the connector attached to a circuit board; the improved fixing ear latch mainly comprises an ear latch, the ear latch is provided with a latching member having slight elasticity and positioned at a side surface thereof, and an insertion groove is provided to a main body of the electronic connector for mounting the ear latch. When the ear latch is inserted, the latching member is compressed by an adjacent wall surface of the insertion groove, the ear latch slides into an abutting portion preset in the insertion groove to be abutted and positioned, although the main body of the connector will not be damaged during insertion so as to attain improve the problem of a conventional ear latch which uses a protruding barb to forcedly slide into the insertion groove, namely the protruding barb scrapes and damages the insertion groove and the conventional ear latch is not easily mounted. However, the retention force of the elastic latching member of the ear latch is limited, and because the latching member has elasticity, it would easily make the ear latch to easily loosen or move.

SUMMARY

In order to resolve the above problem, the present disclosure provides an electrical connector which comprises: an insulative body; a plurality of terminals fixed in the insulative body; at least two fitting nails retained in the insulative body. The insulative body has a bottom surface and a rear surface, the insulative body is provided with at least two receiving grooves extending along a front-rear direction, each receiving groove has a rear insertion opening opened at the rear surface; the receiving groove has a lower opening opened at the bottom surface, an inner side wall of the receiving groove is provided with a guiding groove and a retaining groove which extend along a rear-to-front direction. The at least two fitting nails are respectively retained in the receiving grooves of the insulative body. Each fitting nail comprises: a plate body; a lateral protrusion extending along the front-rear direction and protruding along a lateral direction from the plate body; and a soldering portion extending at a lower edge of the plate body. The plate body of the fitting nail is inserted into the receiving groove via the rear insertion opening; the lateral protrusion passes through the guiding groove and is received in the retaining groove, a rear end of the lateral protrusion is stopped by an inner rear wall surface of the retaining groove, a lower edge of the lateral protrusion is stopped by an inner lower wall surface of the retaining groove; an upper edge contour of the fitting nail comprises at least one stepped contour which cooperates with an inner upper wall surface of the receiving groove so as to limit a position of the fitting nail moving toward the upper and a position of the fitting nail moving toward the front; the soldering portion is exposed to the lower opening In an embodiment of the present disclosure, an inner side surface of the guiding groove is an inner side surface extending obliquely along the rear-to-front direction toward the receiving groove.

In an embodiment of the present disclosure, a front end and the rear end of the lateral protrusion are integrally connected to the plate body.

In an embodiment of the present disclosure, the front end of the lateral protrusion is formed as an oblique guiding surface.

In an embodiment of the present disclosure, all the lateral protrusions of all the fitting nails protrude towards the same lateral direction of the insulative body; all the guiding grooves and all the retaining grooves of all the receiving grooves are positioned at the same lateral direction of the insulative body.

In an embodiment of the present disclosure, a side surface of the retaining groove of one of the receiving grooves is opened outwardly; a front surface of the insulative body has a long groove; the retaining groove of the one of the receiving groove is communicated with the long groove.

In an embodiment of the present disclosure, two inner wall surfaces of two sides of the insulative body which are positioned below the guiding groove are each formed with a recessed portion, the recessed portion and a corresponding side surface of the fitting nail form an enlarged gap at the lower opening.

In an embodiment of the present disclosure, the upper edge contour of the fitting nail comprises at least one stepped contour; the inner upper wall surface of the receiving groove correspondingly comprises at least one stepped contour which cooperates with the at least one stepped contour of the fitting nail so as to limit a position of the fitting nail moving toward the upper and a position of the fitting nail moving toward the front.

In an embodiment of the present disclosure, the upper edge contour of the fitting nail comprises one small stepped contour and one large stepped contour; the inner upper wall surface of the receiving groove correspondingly comprises one small stepped contour and one large stepped contour.

In the electrical connector of the embodiment of the present disclosure, the lateral protrusion of the fitting nail is latched in the retaining groove of the receiving groove of the insulative body, the upper edge contour of the fitting nail cooperates with the inner upper wall surface of the receiving groove to allow the fitting nail to be firmly fixed in the receiving groove of the insulative body. There is not any destructive interference between the fitting nail and the receiving groove, therefore fitting nail is easily inserted into a predetermined position and the lateral protrusion of the fitting nail is latched in the retaining groove of the receiving groove so as to provide a firm and robust retention force.

Technical features and advantages of the present disclosure are widely summarized as above, so as to better understand the following detailed description. Other technical feature making up technical solutions of the claims of the present disclosure and other advantages will be described below. A person skilled in the art of the present disclosure shall understand that the concept and specific embodiments disclosed below may be easily used to modify or design other configuration or manufacturing approach so as to realize the same object as the present disclosure. A person skilled in the art of the present disclosure shall also understand that, such an equivalent configuration or approach cannot be departed from the spirit and scope of the present disclosure defined by the appended claims.

BRIEF DESCRIPTION OF THE DRAWINGS

The various respects of the present disclosure may be best understood by the following detailed description taken in connection with the accompanying Figures. It should be noted that, according to a standard implementing mode of the industries, features are not drawn as the scale. In practice, for the sake of clear explanation, various features may be arbitrarily enlarged or reduced in dimension.

DETAILED DESCRIPTION OF THE PREFERRED EMBODIMENTS

The following disclose content provides various embodiments or exemplifications used to implement various features of the present disclosure. Specific examples of elements and arrangements are described as follows, so as to simplify the disclosed content of the present disclosure. Certainly, these are merely examples, and are not used to limit the present disclosure. For example, in the following description, that a first feature is formed on or above a second feature may comprise an embodiment that the first feature and the second are formed to directly contact with each other, may also comprise an embodiment that other feature is formed between the first feature and the second feature, therefore the first feature and the second feature do not directly contact with each other. Moreover, the present disclosure may allow a symbol and/or a character of an element to be repeated in different examples. The repetition is used for simplification and clearness, but is not used to dominate a relationship between various embodiments and/or discussed structures.

Moreover, the present disclosure may use spatial corresponding terminologies, such as "below", "lower than", "relative lower", "higher than", "relative high" and the like, so as to describe a relationship between an elements or feature and another element or feature. Spatial corresponding terminologies are used to comprise various orientations of an apparatus in use or operation besides orientations illustrated in Figures. Or the apparatus may be orientated (rotated by 90 degrees or at other orientation), and the corresponding spatial description in the present disclosure may be correspondingly explained. It should be understood that, when a feature is formed to another feature or above a board, other feature may presented between them.

Figure 1:
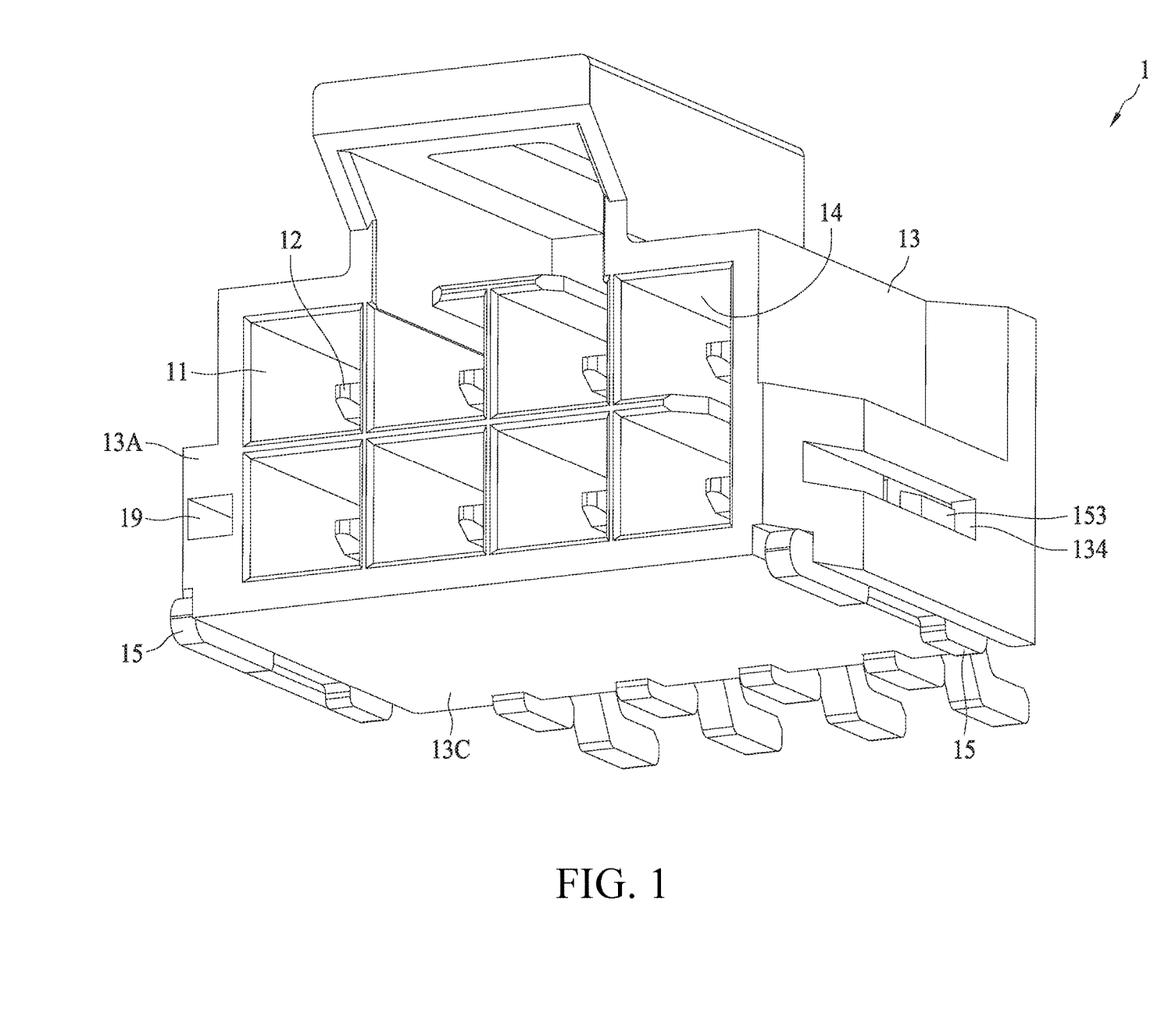
FIG. 1 is a schematic view of an electrical connector of an embodiment of the present disclosure.
Figure 2:
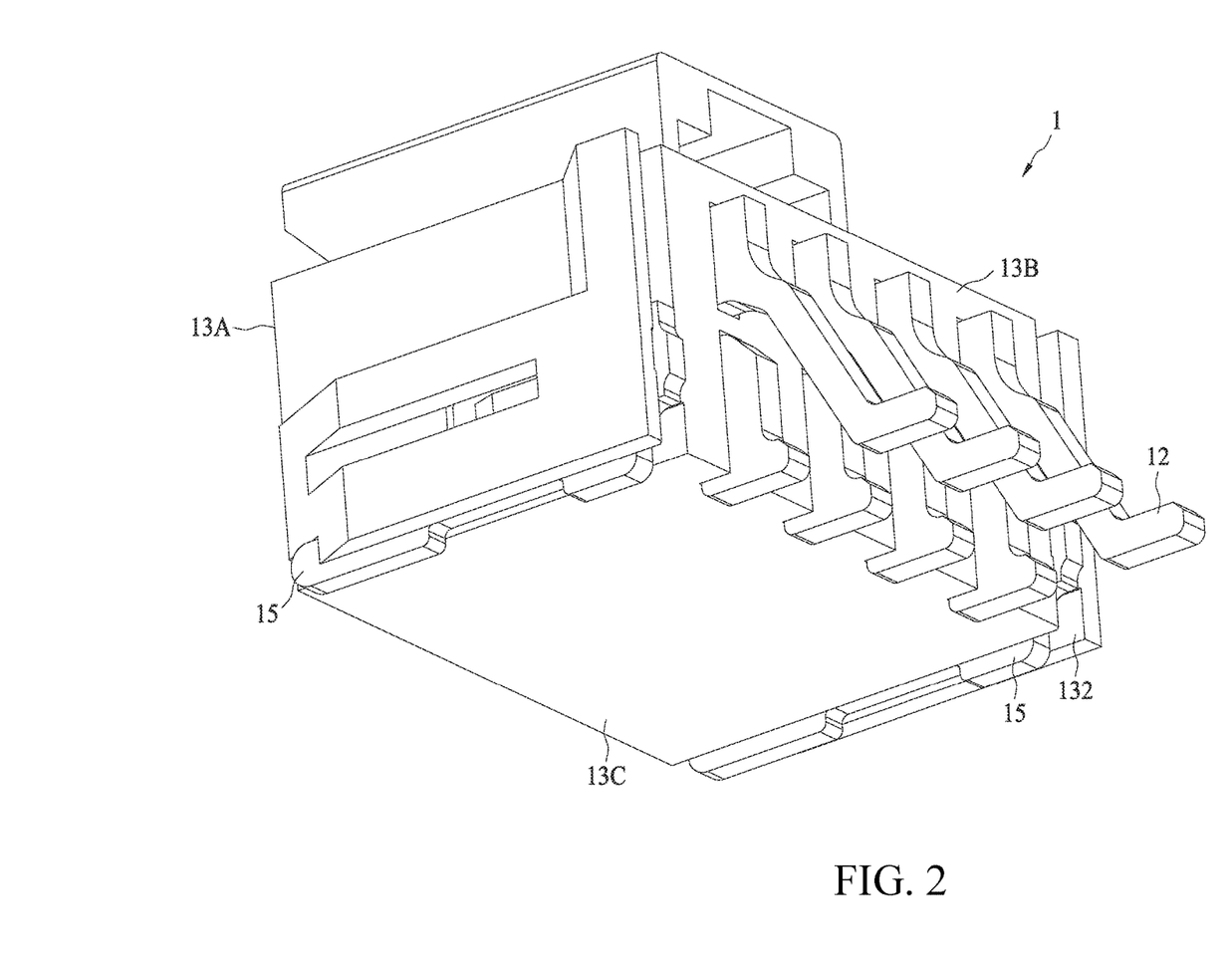
FIG. 2 is a schematic view of the electrical connector of FIG. 1 viewed from another angle.

FIG. 1 is a schematic view of an electrical connector 1 of an embodiment of the present disclosure, FIG. 2 is a schematic view of the electrical connector 1 of FIG. 1 viewed from another angle. The electrical connector 1 comprises an insulative body 13, a plurality of conductive terminals 12 and at least two fitting nails 15. The insulative body 13 has a front surface 13A, a rear surface 13B and a bottom surface 13C. The front surface 13A of the insulative body 13 comprises a plurality of insertion holes 11 for insertion of a mating connector (not shown in Figures), a plurality of terminal grooves 14 each are correspondingly communicated with one insertion hole 11. The plurality of conductive terminals 12 are respectively fixed in the terminal grooves 14 of the insulative body 13, a mating end of the conductive terminal 12 is positioned in the insertion hole 11; when the mating connector is inserted, the mating end of the conductive terminal 12 and a terminal of the mating connector establish an electrical connection.

Figure 3:
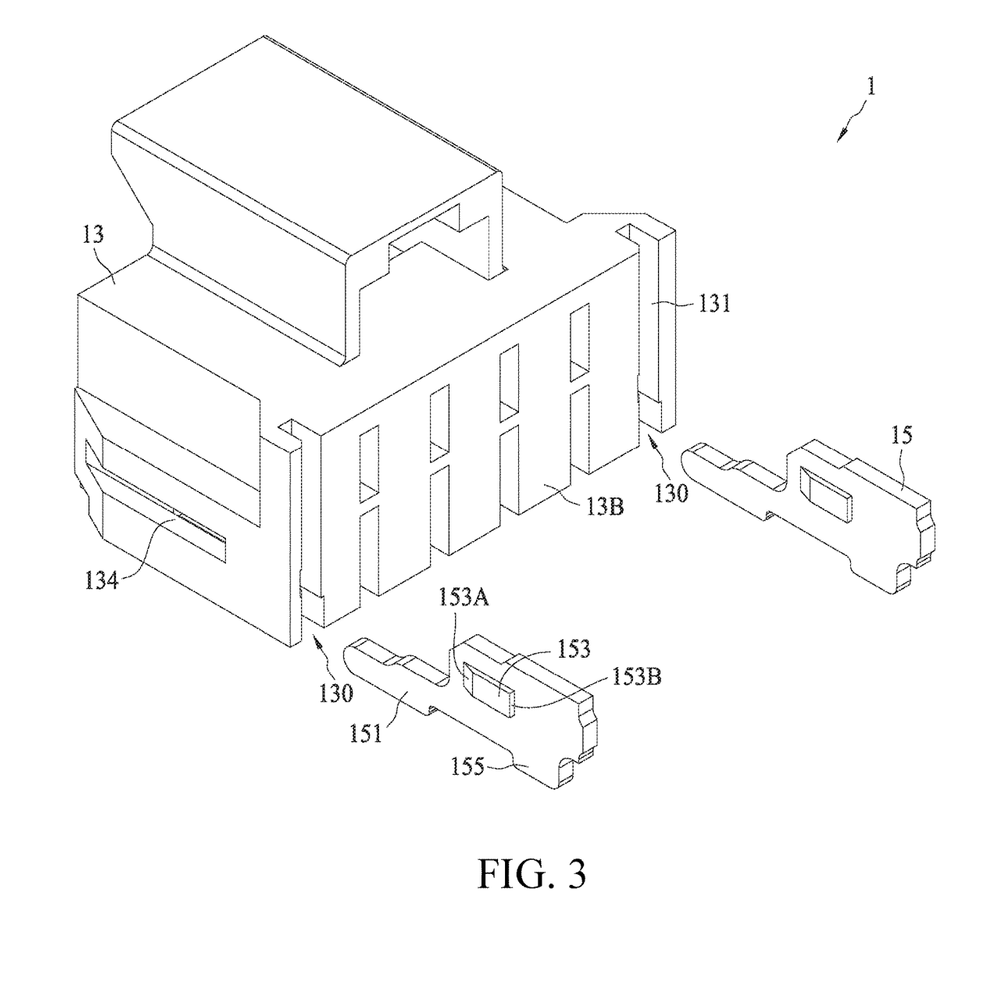
FIG. 3 is an exploded view of the electrical connector of FIG. 1 viewed from another angle.
Figure 4:
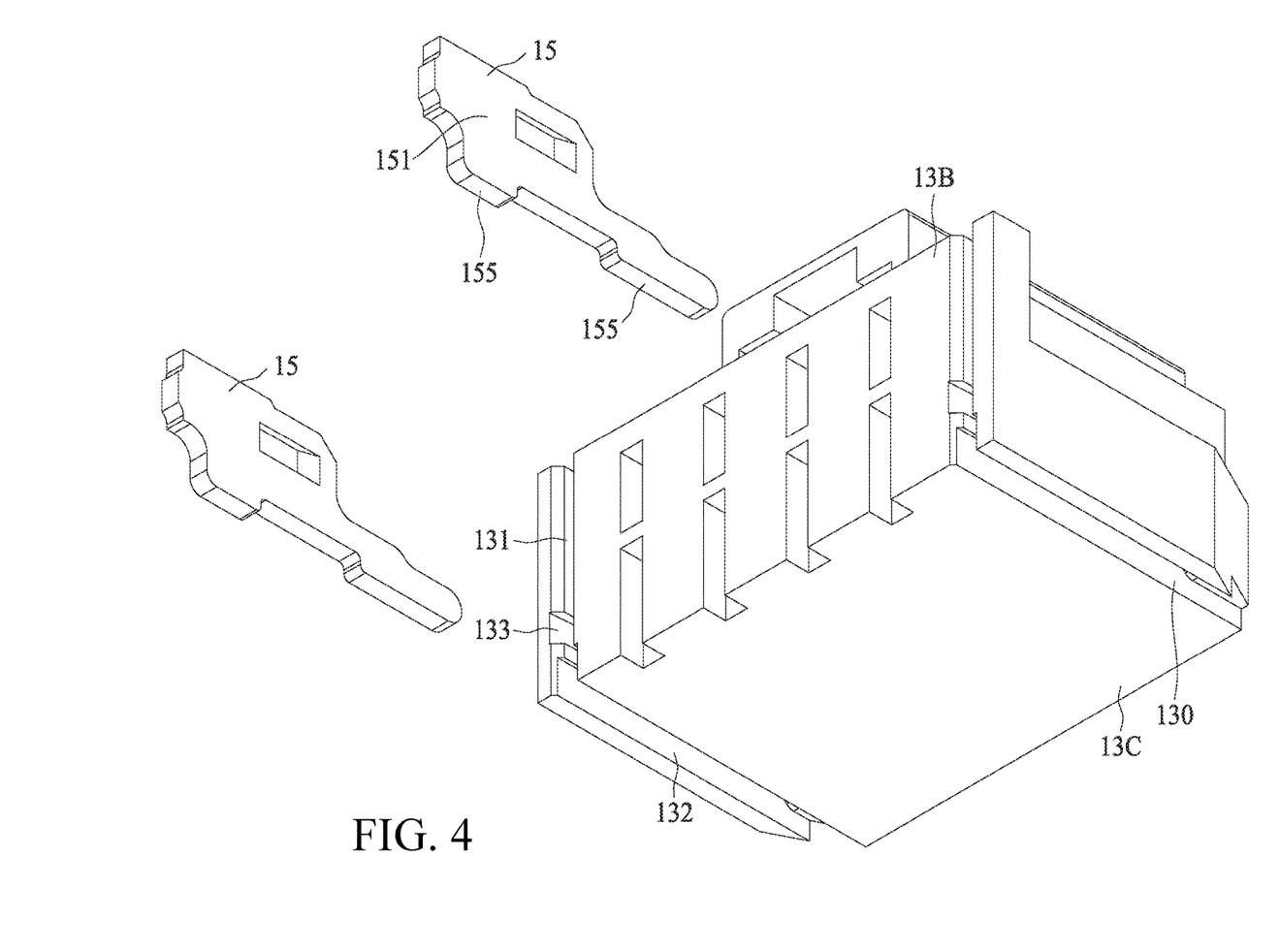
FIG. 4 is an exploded view of the electrical connector of FIG. 1 viewed from another angle.

FIG. 3 is an exploded view of the electrical connector 1 of FIG. 1 viewed from another angle, FIG. 4 is an exploded view of the electrical connector 1 of FIG. 1 viewed from another angle. The insulative body 13 is provided with a plurality of receiving grooves 130 extending along a front-rear direction. The electrical connector 1 comprises the fitting nails 15 respectively retained in the receiving grooves 130 of the insulative body 13. Each fitting nail 15 comprises a plate body 151; a lateral protrusion 153 protruding along a lateral direction from the plate body 151 and extending along the front-rear direction of the insulative body 13; and a soldering portion 155 at a lower edge of the plate body 151. In an embodiment of the present disclosure, the lateral protrusion 153 is long, a front end 153A and a rear end 153B of the lateral protrusion 153 are integrally connected to the plate body 151, an upper edge and a lower edge of the lateral protrusion 153 are also integrally connected to the plate body 151. In another embodiment, the upper edge and the lower edge of the lateral protrusion 153 may be torn and separated from the plate body 151. The lateral protrusions 153 of the fitting nails 15 protrude toward the same lateral direction (toward the left side in the Figures) of the insulative body 13; in other words, the fitting nails 15 can be chose to use the same component.

The receiving groove 130 has a rear insertion opening 131 opened at the rear surface 13B of the insulative body 13, the receiving groove 130 has a lower opening 132 opened at the bottom surface 13C of the insulative body 13. An inner side wall of the receiving groove 130 is provided with a guiding groove 133 and a retaining groove 134 which extend along a rear-to-front direction. When the fitting nail 15 is mounted to the insulative body 13, the plate body 151 of the fitting nail 15 is inserted into the receiving groove 130 via the rear insertion opening 131, the lateral protrusion 15 is received in the retaining groove 134 after the lateral protrusion 15 passes through the guiding groove 133 of the receiving groove 130.

The insulative body 13 has the two receiving grooves 130 respectively provided at the left side and the right side; the guiding groove 133 and the retaining groove 134 of each receiving groove 130 are positioned at the same lateral direction (at the left side in the Figures), namely the guiding groove 133 and the retaining groove 134 of the receiving groove 130 which is provided at the left side of the insulative body 13 are recessed toward the left side, the guiding groove 133 and the retaining groove 134 of the receiving groove 130 which is provided at the right side of the insulative body 13 are also recessed toward the left side. In this way, the two receiving grooves 130 respectively provided at the left side and the right side of the insulative body 13 may respectively the two receive fitting nails 15 which are the same components.

Figure 5:
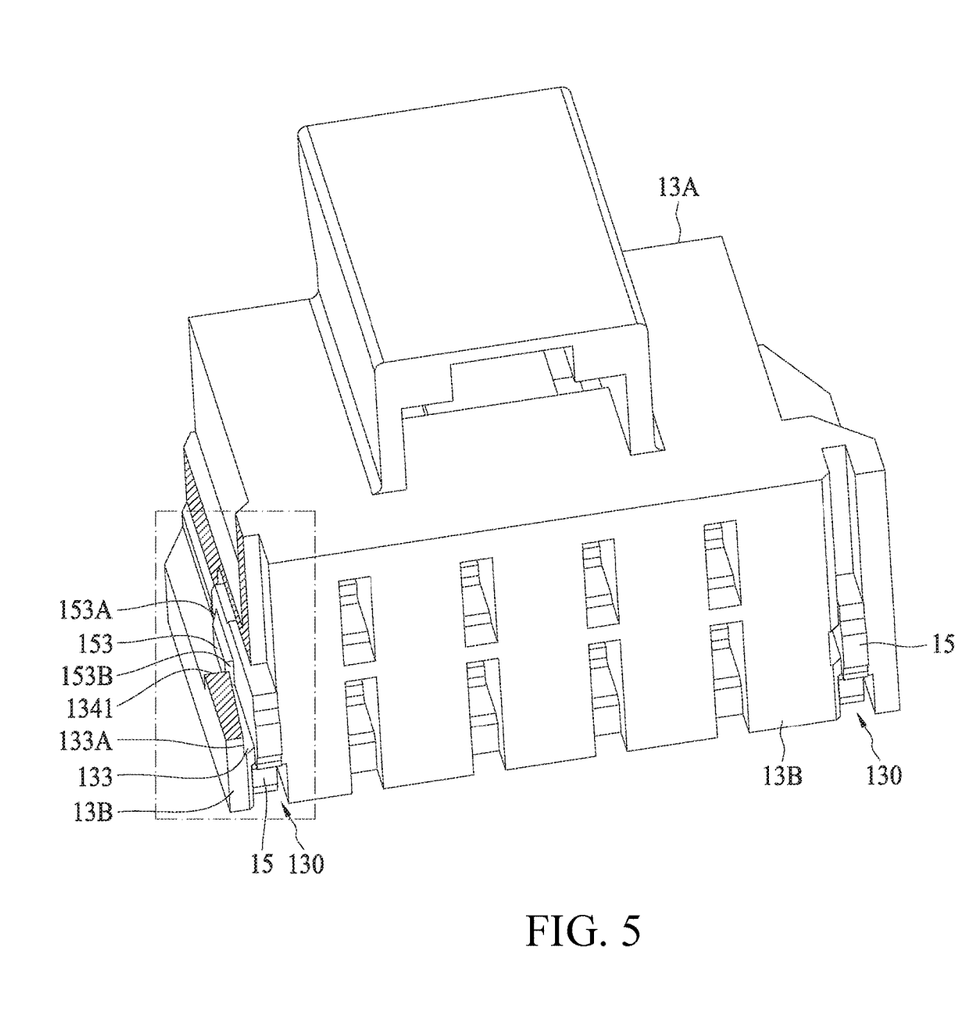
FIG. 5 is a schematic view of the electrical connector of FIG. 1 viewed from another angle.
Figure 6:
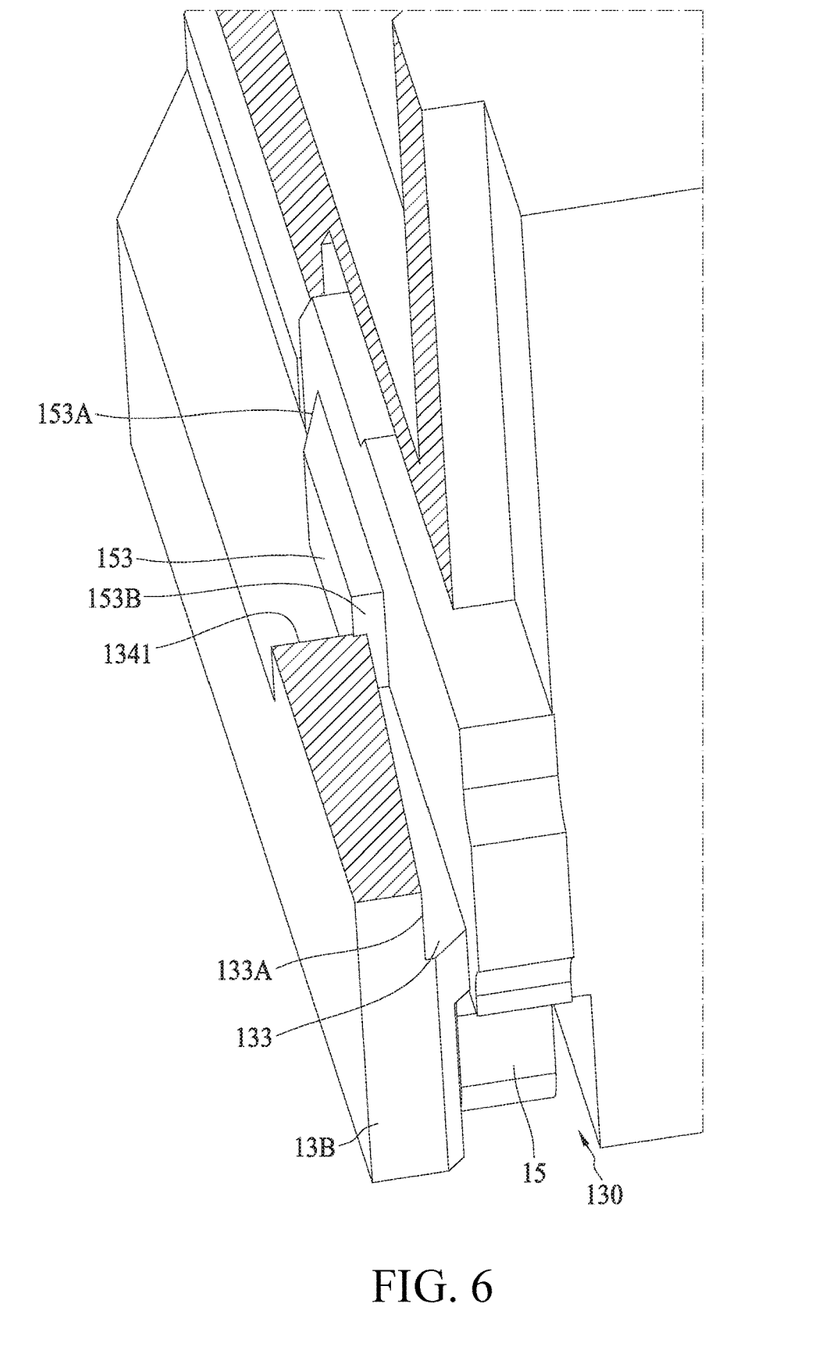
FIG. 6 is a partially enlarged view of FIG. 5.

FIG. 5 is a schematic view of the electrical connector 1 of FIG. 1 viewed from another angle and FIG. 6 is a partially enlarged view of FIG. 5, in which the insulative body 13 is partially cut off so as to illustrate a design of the insulative body 13 for insertion and guiding of the fitting nail 15. An inner side surface 133A of the guiding groove 133 obliquely extends from the rear surface 13B of the insulative body 13 toward the front surface 13A and the receiving groove 130 (or a width of the guiding groove 133 is taper from the rear surface 13B toward the front surface 13A, the guiding groove 133 is configured as a configuration which is wide at the rear of the guiding groove 133 and narrow at the front of the guiding groove 133). The front end 153A of the lateral protrusion 153 of the fitting nail 15 is formed as an oblique guiding surface; when the fitting nail 15 is assembled to the insulative body 13, the oblique guiding surface of the front end 153A of the lateral protrusion 153 allows the lateral protrusion 153 to easily enter into the guiding groove 133, the lateral protrusion 153 slides frontwardly along the inner side surface 133A of the guiding groove 133, and will push a wall of the receiving groove 130 positioned at a side where the guiding groove 133 is present; when the lateral protrusion 153 passes through the guiding groove 133, the lateral protrusion 153 immediately enters into the retaining groove 134, at the same time, the wall, which is positioned at the side where the guiding groove 133 is present and is pushed, of the receiving groove 130 rebounds, and an inner rear wall surface 1341 of the retaining groove 134 at rear end is positioned behind the rear end 153B of the lateral protrusion 153.

Figure 7:
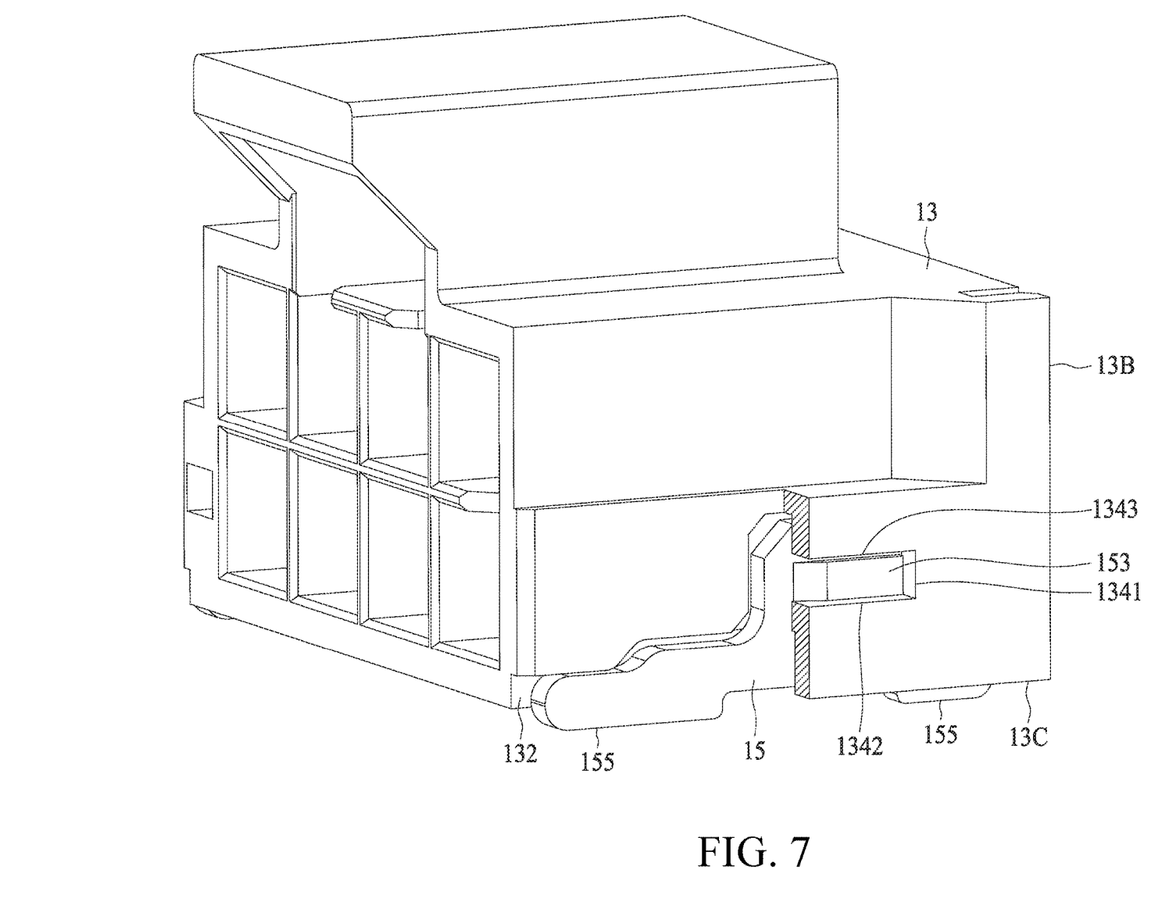
FIG. 7 is a schematic view of the electrical connector of FIG. 1 viewed from another angle.

FIG. 7 is a schematic view of the electrical connector 1 FIG. 1 viewed from another angle, in which the insulative body 13 is partially cut off so as to illustrate a latching design between the fitting nail 15 and the insulative body 13. After the fitting nail 15 has been inserted into the receiving groove 130, the rear end 153B of the lateral protrusion 153 is stopped by the inner rear wall surface 1341 of the retaining groove 134, therefore the lateral protrusion 153 will not remove out from the rear surface 13B of the insulative body 13. Moreover, after the fitting nail 15 has been inserted into the receiving groove 130, a lower edge of the lateral protrusion 153 is stopped by an inner lower wall surface 1342 of the retaining groove 134, therefore the lateral protrusion 153 will not move toward the bottom surface 13C of the insulative body 13, an inner upper wall surface 1343 of the retaining groove 134 also can stop an upward movement of the lateral protrusion 153.

Figure 8:
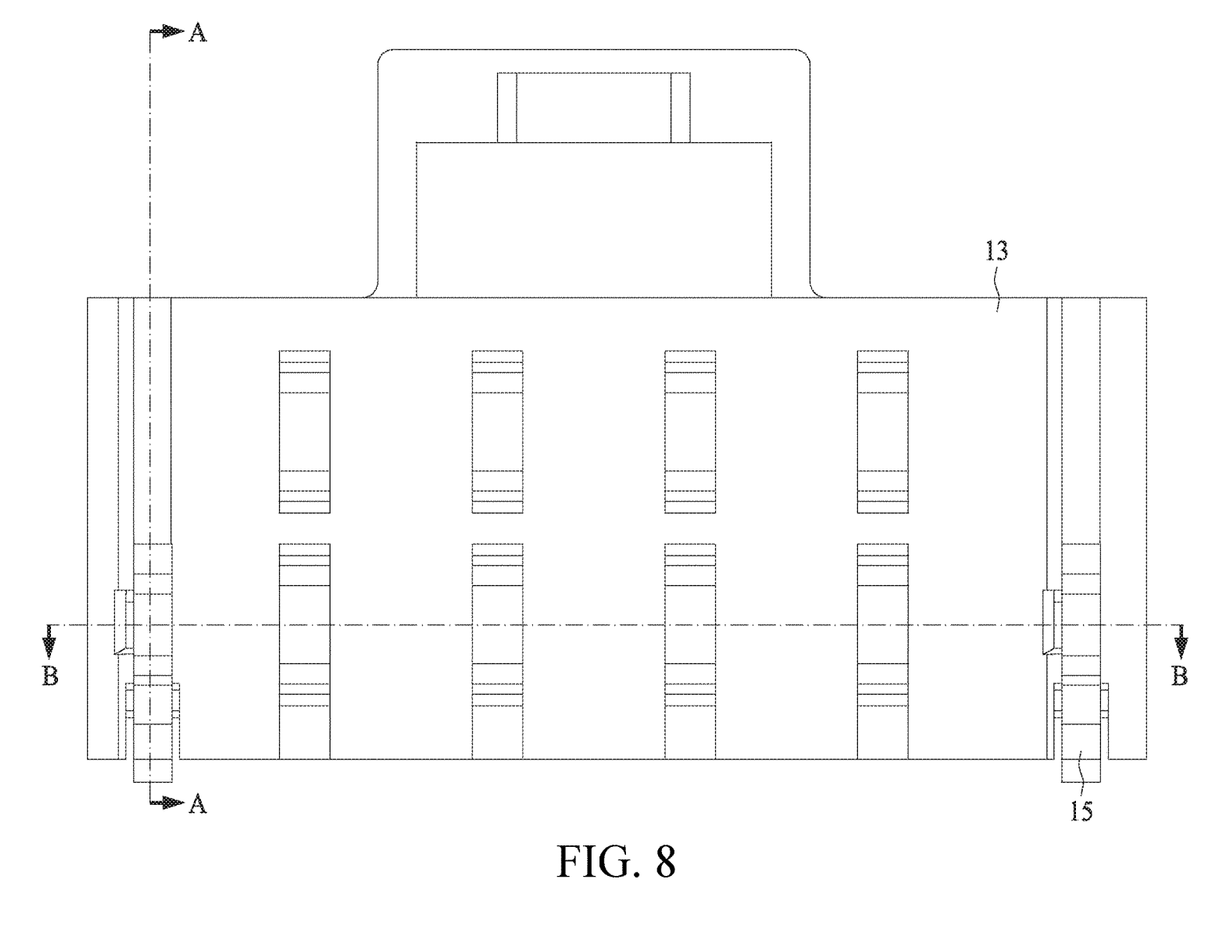
FIG. 8 is a rear view of the electrical connector of FIG. 1.
Figure 9:
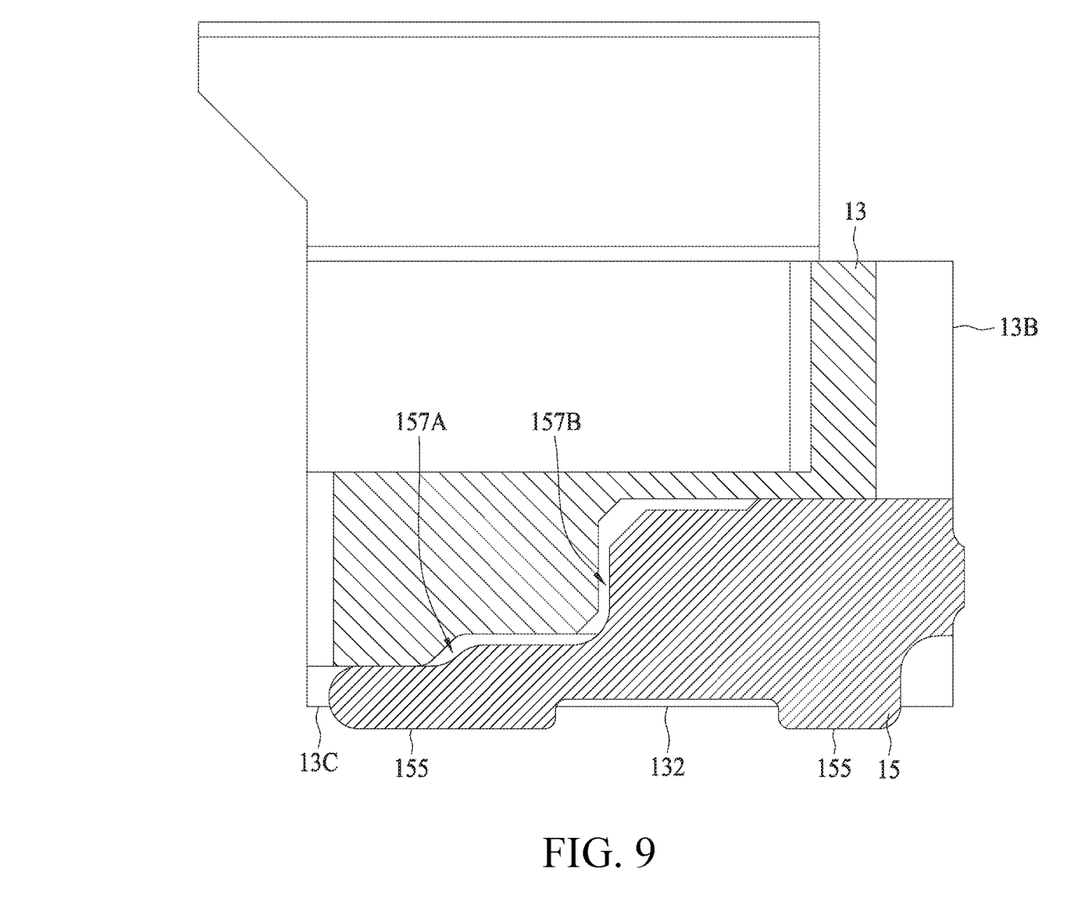
FIG. 9 is a cross sectional view taken along a line A-A of FIG. 8.
Figure 10:
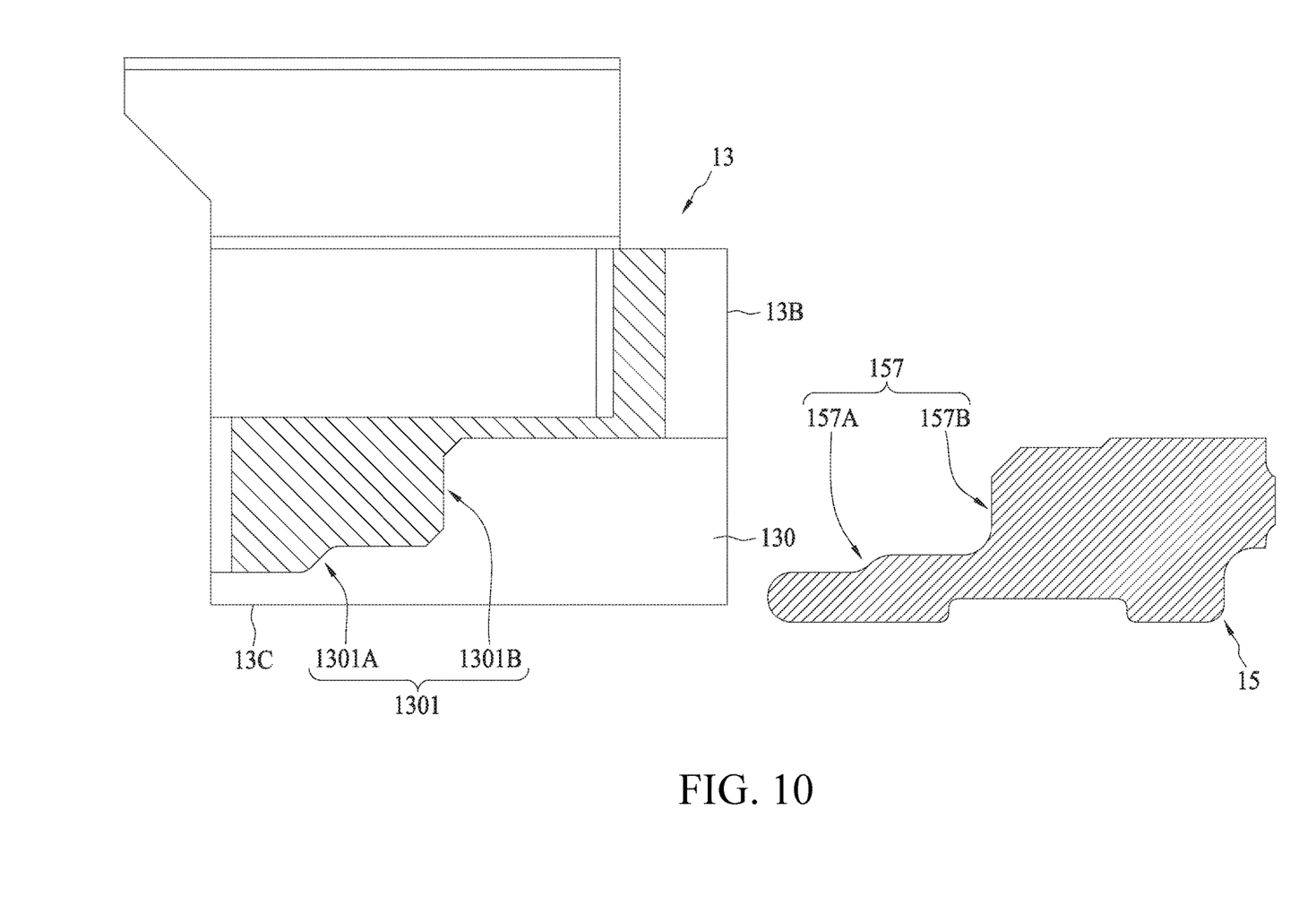
FIG. 10 is an exploded view of FIG. 9.

FIG. 8 is a rear view of the electrical connector 1 of FIG. 1; FIG. 9 is a cross sectional view taken along a line A-A of FIG. 8; FIG. 10 is an exploded view of FIG. 9 with the fitting nail 15 and the insulative body 13 separated. An upper edge contour 157 of the fitting nail 15 comprises at least one stepped contour which cooperates with an inner upper wall surface 1301 of the receiving groove 130 so as to limit a position of the fitting nail 15 moving toward the upper and a position of the fitting nail 15 moving toward the front. For example, the inner upper wall surface 1301 of the receiving groove 130 correspondingly comprises at least one stepped contour which cooperates with the at least one stepped contour of the fitting nail 15 so as to limit the position of the fitting nail 15 moving toward the upper and the position of the fitting nail 15 moving toward the front; specifically, the upper edge contour 157 of the fitting nail 15 comprises one small stepped contour 157A and one large stepped contour 157B; the inner upper wall surface 1301 of the receiving groove 130 correspondingly comprises one small stepped contour 1301A and one large stepped contour 1301B. The large stepped contour 157B and the small stepped contour 157A of the fitting nail 15 respectively cooperate with the large stepped contour 1301B and the small stepped contour 1301A of the receiving groove 130, so as to limit the upward movement of the fitting nail 15 relative to the insulative body 13 and the frontward movement of the fitting nail 15 relative to the insulative body 13.

The lateral protrusion 153 of the fitting nail 15 is latched in the retaining groove 134 of the receiving groove 130 of the insulative body 13; moreover, the upper edge contour 157 of the fitting nail 15 cooperates with the inner upper wall surface 1301 of the receiving groove 133 to allow the fitting nail 15 to be firmly fixed in the receiving groove 130 of the insulative body 13. There is not any destructive interference between the fitting nail 15 and the receiving groove 130, therefore fitting nail 15 is easily inserted into a predetermined position and the lateral protrusion 153 of the fitting nail 15 is latched in the retaining groove 134 of the receiving groove 130 so as to provide a firm and robust retention force.

Figure 11:
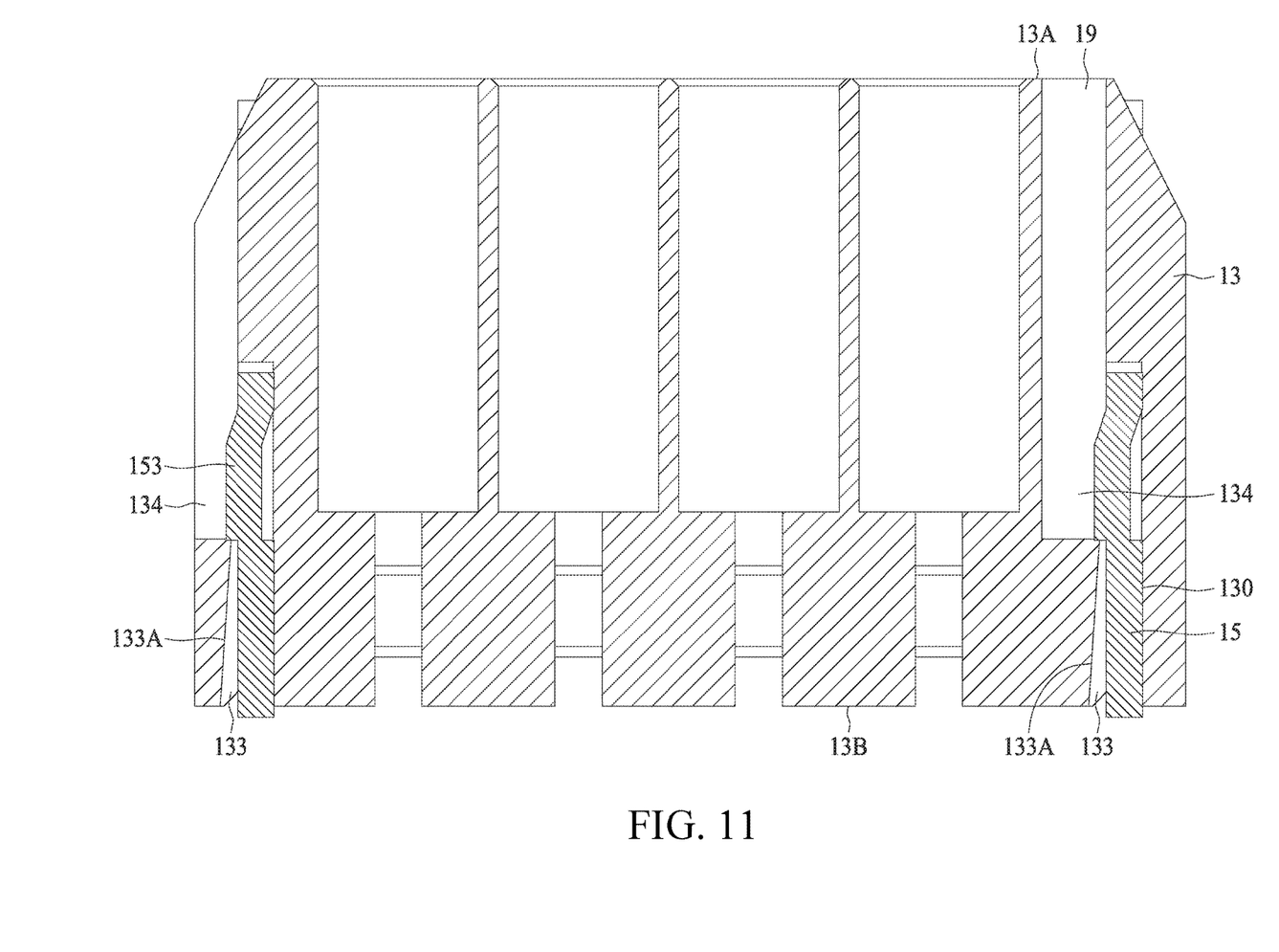
FIG. 11 is a cross sectional view taken along a line B-B of FIG. 8.

FIG. 11 is a cross sectional view taken along a line B-B of FIG. 8. Referring to FIG. 1 and FIG. 11, the insulative body 13 has the two receiving grooves 130 which respectively are provided at the left side and the right side and each receive one fitting nail 15; a side surface of the retaining groove 134 of the receiving groove 130 provided at the left side is opened outwardly; the right side of the front surface 13A of the insulative body 13 has a long groove 19, the retaining groove 134 of the receiving groove 130 provided at the right side is communicated with the long groove 19. The insulative body 13 may be manufactured by use of injection molding; during injection molding, the long groove 19 receives a core pin inserted from the front surface 13A, so as to form the retaining groove 134 of the receiving groove 130; after injection molding is completed, the core pin is removed and the long groove 19 is formed in the insulative body 13.

Figure 12:
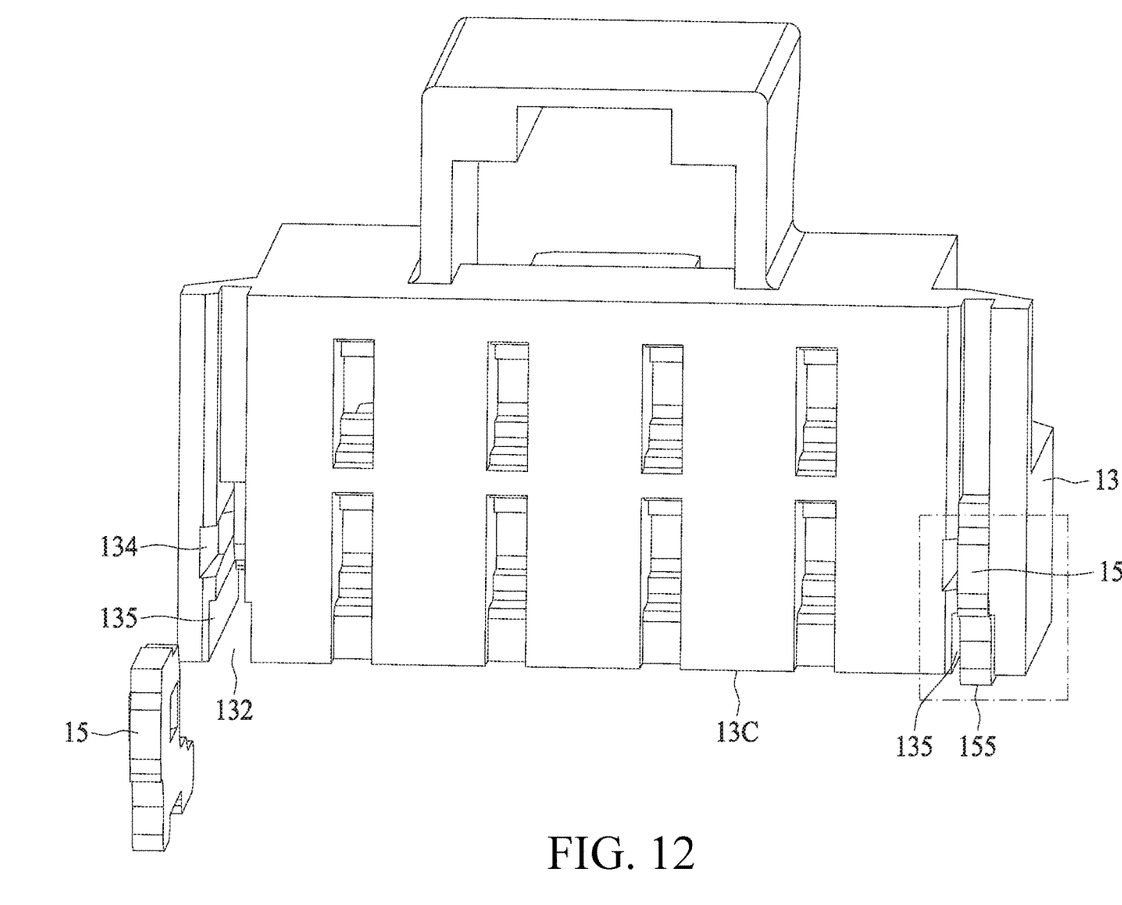
FIG. 12 is a schematic view of the electrical connector of FIG. 1 viewed from another angle.
Figure 13:
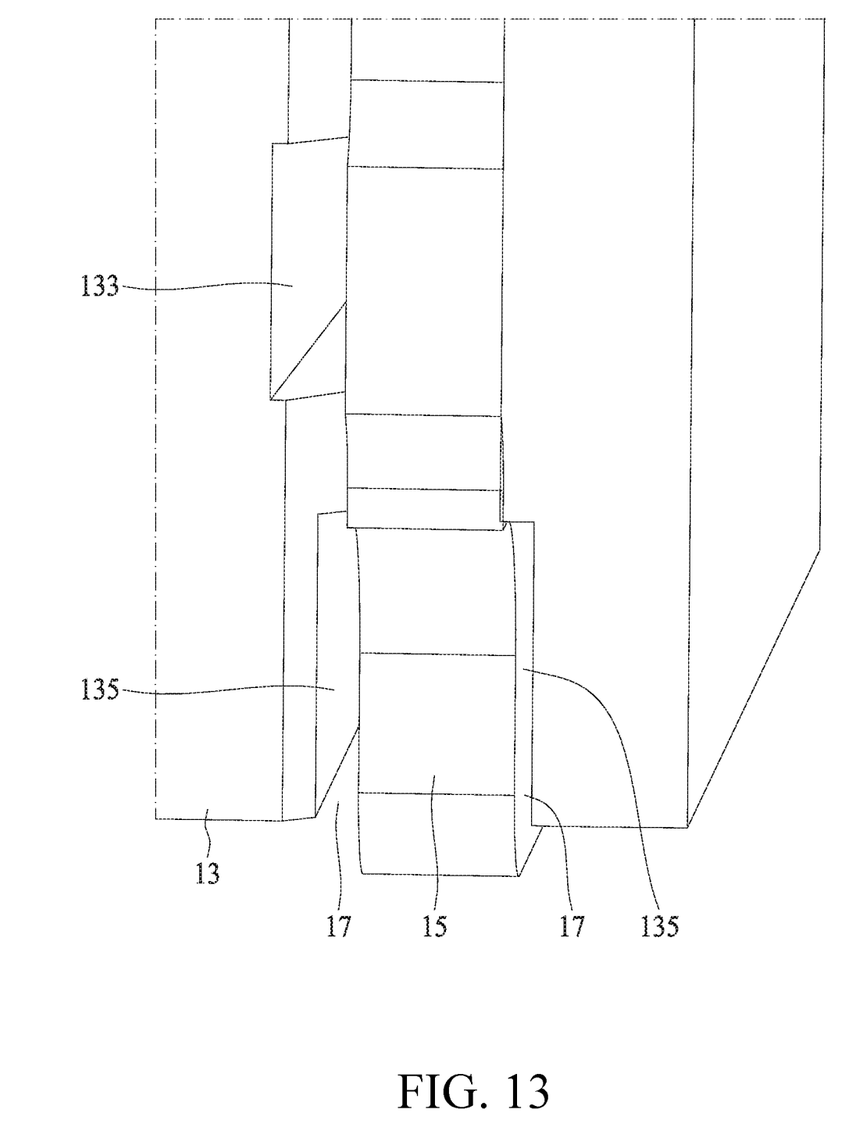
FIG. 13 is a partially enlarged view of FIG. 12.

FIG. 12 is a schematic view of the electrical connector 1 of FIG. 1 viewed from another angle, FIG. 13 is a partially enlarged view of FIG. 12. Referring to FIG. 9, FIG. 12 and FIG. 13, the soldering portion 155 of the fitting nail 15 is exposed to the lower opening 132 of the insulative body 13, namely protrudes from the bottom surface 13C of the insulative body 13. In this way, when the electrical connector 1 is mounted to a board (for example, a circuit board (not shown in Figures)), the soldering portion 155 of the fitting nail 15 may be attached on a solder on the board. In addition, two inner wall surfaces of two sides of the insulative body 13 respectively positioned below the guiding groove 133 (that is, at the lower opening 132 of the insulative body 13) each are formed with a recessed portion 135, an enlarged gap 17 is form between the recessed portion 135 and a corresponding side surface of the fitting nail 15, so as to prevent the solder on the board from climbing upwardly into the inside of the insulative body 13 via capillary siphoning, namely avoid solder climbing.

Features of some embodiments are summarized in above content, so that a person skilled in the art may better understand various aspects of the disclosed content of the present disclosure. A person skilled in the art of the present disclosure shall understand that the disclosed content of the present disclosure may be easily used to design or modify other manufacturing approach or configuration and in turn to realize the same object and/or attain the same advantage as the embodiments of the present disclosure. A person skilled in the art of the present disclosure shall also understand that, such an equivalent approach or configuration cannot be departed from the spirit and scope of the disclosed content of the present disclosure, and a person skilled in the art may make various changes, substitutions and replacements, which are not departed from the spirit and scope of the disclosed content of the present disclosure.

What is claimed is:

1. An electrical connector, comprising:
    an insulative body having a bottom surface and a rear surface, the insulative body being provided with at least two receiving grooves extending along a front-rear direction, each receiving groove having a rear insertion opening opened at the rear surface; the receiving groove having a lower opening opened at the bottom surface, an inner side wall of the receiving groove being provided with a guiding groove and a retaining groove which extend along a rear-to-front direction;
    a plurality of terminals fixed in the insulative body;
    at least two fitting nails respectively retained in the receiving grooves of the insulative body, each fitting nail comprising:
        a plate body;
        a lateral protrusion extending along the front-rear direction and protruding along a lateral direction from the plate body; and
        a soldering portion extending at a lower edge of the plate body;
    the plate body of the fitting nail being inserted into the receiving groove via the rear insertion opening;
    the lateral protrusion passing through the guiding groove and being received in the retaining groove, a rear end of the lateral protrusion being stopped by an inner rear wall surface of the retaining groove, a lower edge of the lateral protrusion being stopped by an inner lower wall surface of the retaining groove;
    an upper edge contour of the fitting nail comprising at least one stepped contour which cooperates with an inner upper wall surface of the receiving groove so as to limit a position of the fitting nail moving toward the upper and a position of the fitting nail moving toward the front;
    the soldering portion being exposed to the lower opening.

2. The electrical connector according to claim 1, wherein an inner side surface of the guiding groove is an inner side surface extending obliquely along the rear-to-front direction toward the receiving groove.

3. The electrical connector according to claim 2, wherein a front end and the rear end of the lateral protrusion are integrally connected to the plate body.

4. The electrical connector according to claim 3, wherein the front end of the lateral protrusion is formed as an oblique guiding surface.

5. The electrical connector according to claim 1, wherein
    all the lateral protrusions of all the fitting nails protrude towards the same lateral direction of the insulative body;
    all the guiding grooves and all the retaining grooves of all the receiving grooves are positioned at the same lateral direction of the insulative body.

6. The electrical connector according to claim 5, wherein
    a side surface of the retaining groove of one of the receiving grooves is opened outwardly;
    a front surface of the insulative body has a long groove;
    the retaining groove of the one of the receiving groove is communicated with the long groove.

7. The electrical connector according to claim 1, wherein two inner wall surfaces of two sides of the insulative body which are positioned below the guiding groove are each formed with a recessed portion, the recessed portion and a corresponding side surface of the fitting nail form an enlarged gap at the lower opening.

8. The electrical connector according to claim 1, wherein
    the upper edge contour of the fitting nail comprises at least one stepped contour;
    the inner upper wall surface of the receiving groove correspondingly comprises at least one stepped contour which cooperates with the at least one stepped contour of the fitting nail so as to limit a position of the fitting nail moving toward the upper and a position of the fitting nail moving toward the front.

9. The electrical connector according to claim 8, wherein
    the upper edge contour of the fitting nail comprises one small stepped contour and one large stepped contour;
    the inner upper wall surface of the receiving groove correspondingly comprises one small stepped contour and one large stepped contour.

* * * * *